United States Patent [19]

Krause

[11] Patent Number: 4,590,947

[45] Date of Patent: May 27, 1986

[54] HIGH-FREQUENCY DEVICE CONTAINING A SURFACE COIL FOR NUCLEAR SPIN RESONANCE APPARATUS

[75] Inventor: Norbert Krause, Heroldsbach, Fed. Rep. of Germany

[73] Assignee: Siemens Aktiengesellschaft, Munich, Fed. Rep. of Germany

[21] Appl. No.: 665,355

[22] Filed: Oct. 26, 1984

[30] Foreign Application Priority Data

Nov. 8, 1983 [DE] Fed. Rep. of Germany ....... 3340337

[51] Int. Cl.$^4$ .............................................. A61B 5/05
[52] U.S. Cl. ................................... 128/653; 324/318; 324/322
[58] Field of Search ................. 128/653; 324/318, 322, 324/300, 311; 336/225, 227, 232

[56] References Cited

U.S. PATENT DOCUMENTS

| Re. 31,895 | 5/1985 | Kneip, Jr. | 324/318 |
|---|---|---|---|
| 1,642,350 | 9/1927 | Adams | 336/225 |
| 2,064,771 | 12/1936 | Vogt | 336/227 |
| 3,953,789 | 4/1976 | Veeman et al. | 324/310 |
| 4,231,008 | 10/1980 | Krueger | 324/320 |
| 4,259,638 | 3/1981 | Krueger | 324/318 |
| 4,362,993 | 12/1982 | Young et al. | 324/309 |
| 4,379,262 | 4/1983 | Young | 324/309 |
| 4,443,760 | 4/1984 | Edelstein et al. | 324/309 |

FOREIGN PATENT DOCUMENTS 2840178 3/1980 Fed. Rep. of Germany ...... 128/653

OTHER PUBLICATIONS

Ackerman et al., "Mapping of Metabolites in Whole Animals by 31P NMR Using Surface Coils", Nature, vol. 283, Jan. 10, 1980, pp. 167–170.
Battocletti et al., "Clinical Applications of the NMR Limb Blood Flowmeter", Proceedings of the IEEE, vol. 67, No. 9, Sep. 1979, pp. 1359–1361.
Ganssen et al., "Nuclear Magnetic Resonance Tomography", Computertomographie 1 (1981).
Mansfield et al., "NMR Imaging in Biomedicine", Academic Press 1982, pp. 201, 292, 312.
"Second Annual Meeting of the Society of Magnetic Resonance in Medicine", Aug. 16 to 19, 1983, San Francisco, pp. 16 and 17, 53 and 54 and 83 and 84.

Primary Examiner—Kyle L. Howell
Assistant Examiner—Ruth S. Smith
Attorney, Agent, or Firm—Kenyon & Kenyon

[57] ABSTRACT

An apparatus for generating a magnetic high-frequency field and/or for receiving corresponding high-frequency signals in nuclear spin resonance apparatus, particularly in medical technology, comprises a coil winding which can be arranged within an at least partially homogeneous magnetic field region of a magnetic field which is generated by a base field magnet and is oriented along an axis, at least in the vicinity of a body or body parts to be examined. This apparatus improves the ability to localize the atomic nuclei emitting the resonance signals. For this purpose, a high-frequency coil winding of substantially rectangular shape is provided, wherein at least two parallel longitudinal conductor sections of the winding are made substantially longer than the transverse conductor sections which connect them to each other and extend transversely. The longitudinal conductor sections are arranged at least largely perpendicularly to the orientation direction of the magnetic field of the base field magnet, and the transverse conductor sections are preferably spaced at a greater distance from the body to be examined than the longitudinal conductor sections.

6 Claims, 7 Drawing Figures

HIGH-FREQUENCY DEVICE CONTAINING A SURFACE COIL FOR NUCLEAR SPIN RESONANCE APPARATUS

BACKGROUND OF THE INVENTION

The present invention relates to a device for generating a magnetic high-frequency field and/or for receiving corresponding high-frequency signals in a nuclear spin resonance apparatus, and especially to such apparatus used in medical technology. Such nuclear spin resonance apparatus comprise a coil winding which can be arranged within an at least partially homogeneous magnetic field region of a magnetic field generated by a base field magnet and oriented along an axis, either directly on a body or body part to be examined, or at least in the vicinity thereof. Such a high-frequency device is described, for instance, in reports of the "Second Annual Meeting of the Society of Magnetic Resonance in Medicine", August 16 to 19, 1983, San Francisco, U.S.A., and in particular pages 16 and 17, 53 and 54 and pages 83 and 84 thereof.

Particularly in the field of medical technology, diagnostic methods have been developed in which integral resonance signals of nuclei of a given element are analyzed by calculation or measurement from the spin density distribution and/or from the distribution of the relaxation times of a body or body part to be examined. Such methods are known under the designation "nuclear magnetic resonance tomography" or "zeugmatography".

A prerequisite for nuclear spin tomography is a strong magnetic field which is generated by a so-called base field magnet and which is as homogeneous as possible in a region of predetermined extent, and in which the body or body part to be examined is placed along an axis which in general coincides with the orientation axis of the magnetic base field. For exciting the atomic nuclei of a given element in the body to a precession motion, a separate coil winding is further required with which a high-frequency magnetic a-c field can be generated and which can also serve for receiving the high-frequency signals connected therewith if no separate measuring coil winding is provided. Optionally, the base field can also be varied locally in order to thereby limit the region which is excited by the signal of the coil winding, to a predetermined extent (topological nuclear resonance; sensitive point method).

If, for instance, the $^{31}P$ nuclei or $^{13}C$ nuclei which occur relatively little as compared to $^1H$ nuclei in the human body are to be excited or their nuclear spin resonance signals are to be received, high-frequency coil windings must be provided which are arranged for reasons of sufficiently high sensitivity in regions of the body close to the surface, i.e., which can be placed particularly on the surface of the body. As high-frequency coil windings which are also designated as surface coils suitable for this purpose, circular windings with one or also several turns are used. See the reports mentioned above. In appropriate resonance experiments it has now been found that due to the effect of the strong magnetic base field required, the components of the much smaller high-frequency magnetic field which are oriented in the direction of the base field, are practically ineffective. The consequence of this is that the sensititvity of such a ring coil in the plane parallel to the static base field differs from the sensitivity in the plane perpendicular thereto in a relatively confusing, complicated manner. This results in difficulties with respect to the local correlation of the signals received by the high frequency ring coil.

SUMMARY OF THE INVENTION

It is therefore an object of the present invention to improve the high-frequency device mentioned above in such a way that more accurate determinations of the local position of the atomic nuclei to be detected in the body or body part to be examined can be made.

The above and other objects of the present invention are achieved by the provision that the high-frequency coil winding is a surface coil and of substantially rectangular shape, and that at least two longitudinal, parallel-extending conductor sections of the winding are made substantially longer than transverse conductor sections which connect the longitudinal sections and extend crosswise thereto, and that the longitudinal conductor sections are arranged at least largely perpendicular to the principal orientation direction of the magnetic field of the base field magnet.

The advantages of this embodiment of the high-frequency device are in particular that, due to the rectangular shape of the high-frequency coil winding and the special orientation of its longitudinal conductor sections, approximately the same field characteristic is developed in the emission of the high-frequency signals in each cross-sectional plane parallel to the base field and perpendicularly to the body surface. The same also applies to the case of receiving. It can then be achieved that the received high-frequency signals can be assigned more unambiguously to an area which is defined by the geometric extent of the area between the longitudinal conductor sections of the high-frequency coil winding.

Other advantages, features and embodiments of the invention will be apparent from the detailed description which follows.

BRIEF DESCRIPTION OF THE DRAWINGS

The invention will be explained in greater detail in the following detailed description with reference to the drawings, in which.

DETAILED DESCRIPTION

Figure 1:
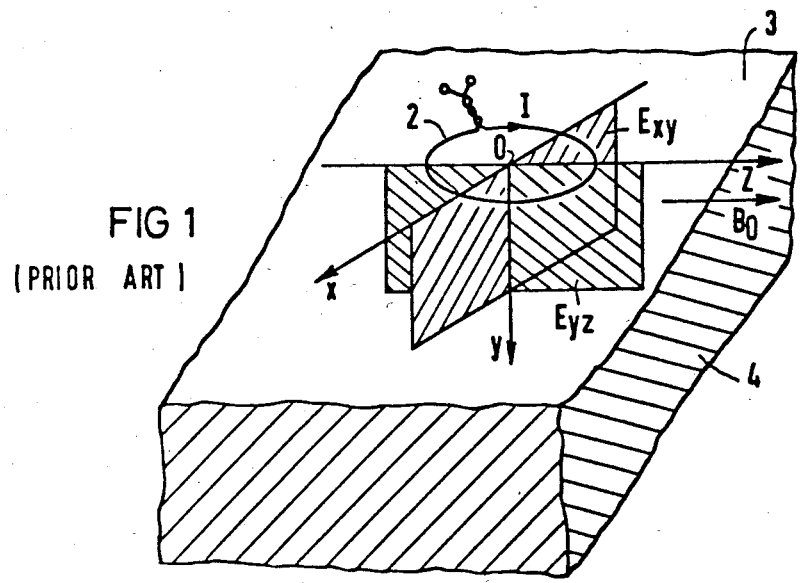
FIG. 1 shows schematically the arrangement of a known high-frequency coil winding.

With reference now to the drawings, FIG. 1 shows a known ring coil 2 having, for instance, one turn, which is placed on the surface 3 of a body or body part 4 to be examined concentrically about a point 0. This body part is placed in the manner known per se in a base field $B_0$, which is at least partially homogeneous, of a corresponding magnet of nuclear spin resonance apparatus, not shown in the figure. An orthogonal x-y-z coordinate system is placed through the point 0 in such a manner that the z-axis points in the orientation direction of the magnetic base field $B_0$. In addition, the x-y plane and the y-z plane are shown in the figure in greater detail and are designated with $E_{xy}$ and $E_{yz}$. By means of a high-frequency a-c current I through the ring coil 2, a short-time high-frequency field with the field strength $B_1$ which is required for appropriate resonance experiments is generated. The ring coil can serve also as a receiver for the high-frequency signal from the interior of the body part 4 which can be received after the high-frequency field is shut off.

Since the high-frequency a-c field of the ring coil 2 with the field strength $B_1$ is superimposed by the very substantially stronger magnetic base field $B_0$, it is found that the lines of constant effective a-c field strength $B_1$ in the y-z plane $E_{yz}$ differ from the lines in the x-y plane $E_{xy}$ in a complicated manner as well known by those skilled in the art. The field lines resulting in these transversal planes for the arrangement according to FIG. 1 are juxtaposed in the diagrams of FIGS. 2 and 3 with arbitrary units. The relative field strength conditions determined are indicated alongside the respective curves. As can be seen directly, especially from the diagram of FIG. 3, the curve does not allow an unambiguous spatial correlation of the signal source.

Figure 4:
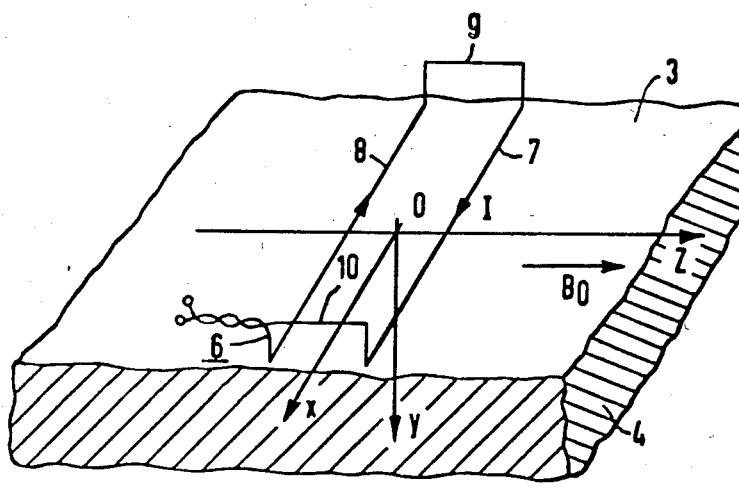
FIG. 4 shows a high-frequency coil winding for the device according to the invention.
Figure 7:
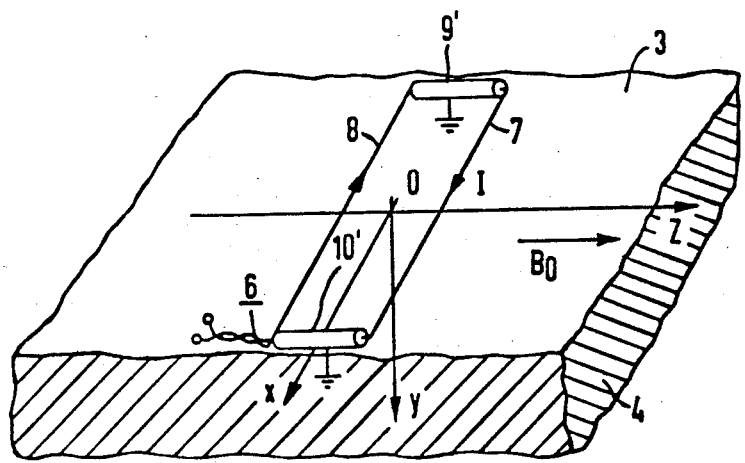
FIG. 7 shows one arrangement for providing high frequency shielding.

This difficulty is reduced very substantially by the embodiment of the high-frequency coil winding according to the invention. An embodiment of such a coil winding is shown in FIG. 4, parts agreeing with FIG. 1 being provided with the same reference symbols. This coil winding, designated with 6, must be placed on only one side of the body part 4 to be examined. According to the definition this is understood to include the arrangement of the coil winding directly on the body surface 3 as well as at a small distance of, for instance, several centimeters above the same. The high-frequency coil winding 6 has, according to the invention, a design in the form of an elongated rectangle, i.e., it comprises two parallel longitudinal conductor sections 7 and 8, between which transverse conductor sections 9 and 10 extend. The coil winding 6 is aligned with respect to the magnetic base field $B_0$ in such a manner that its longitudinal conductor sections 7 and 8 extend at least approximately at right angles to this field. The transverse conductor sections 9 and 10, which are substantially shorter than the longitudinal conductor sections 7 and 8 are therefore essentially parallel to this base field. Advantageously, the longitudinal conductor sections 7 and 8 are at least three times longer than the transverse conductor section 9 and 10. In order to reduce end effects of the coil winding 6, the transverse conductor sections 9 and 10 are lifted off the body surface 3 so that they are located at a larger distance from the signal source in the body part 4 than, by comparison, the two longitudinal conductor sections 7 and 8. In addition to this measure for reducing end effects shown in the figure, other measures such as high-frequency-shielding of the transverse conductor sections also can be provided, as shown in FIG. 7, wherein the transverse conductor sections 9' and 10' are shielded by coaxial cables having grounded cable jackets.

With the embodiment of the coil winding 6 according to the invention, a more unambiguous directional characteristic is achieved than with an annular design of the coil winding. This can be seen from the two diagrams of FIGS. 5 and 6 which correspond to the diagrams of FIGS. 2 and 3.

Figure 2:
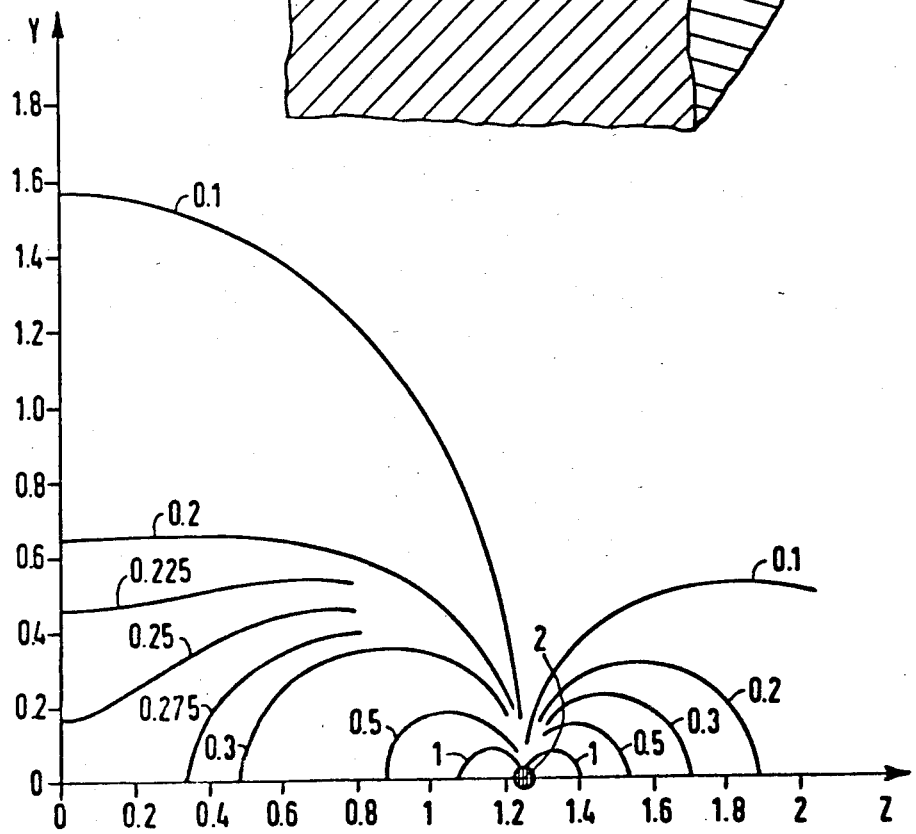
FIGS. 2 and 3 show the corresponding pattern of lines of constant effective magnetic a-c field strength reproduced in two different sectional planes for the coil winding of FIG. 1.
Figure 3:
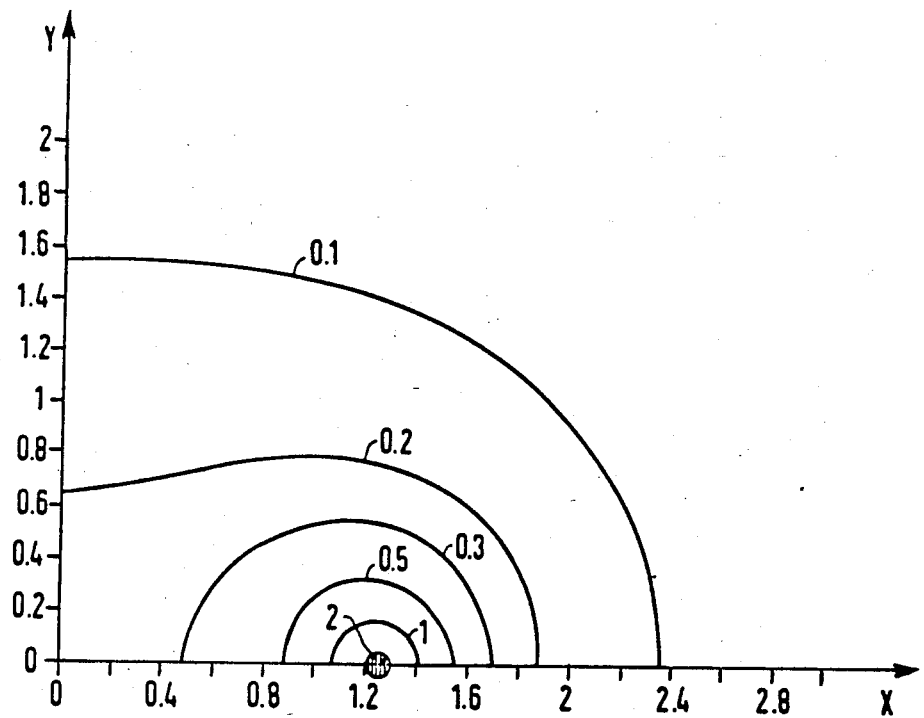
Figure 5:
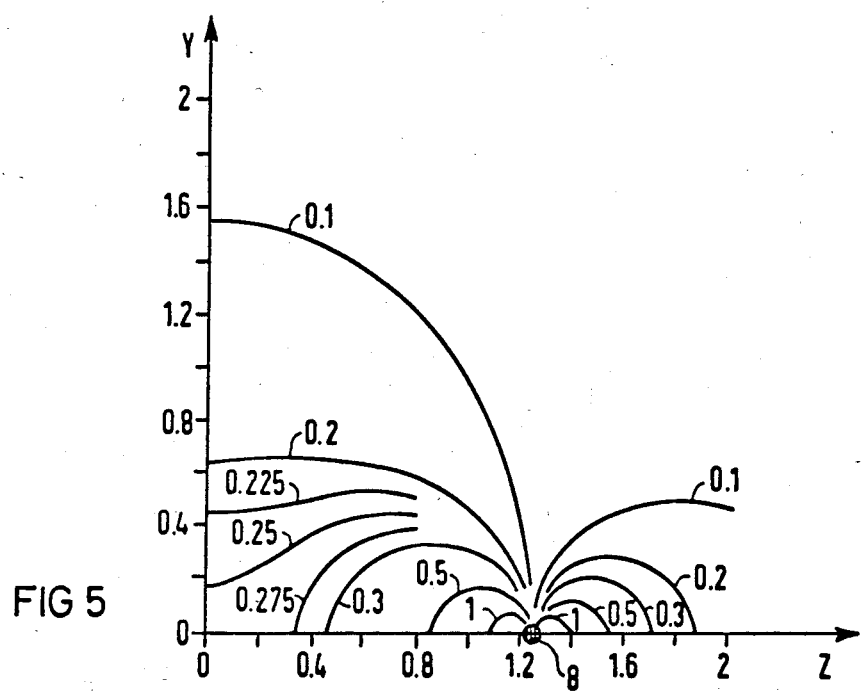
FIGS. 5 and 6 are graphs of the field strength conditions obtained with this winding.
Figure 6:
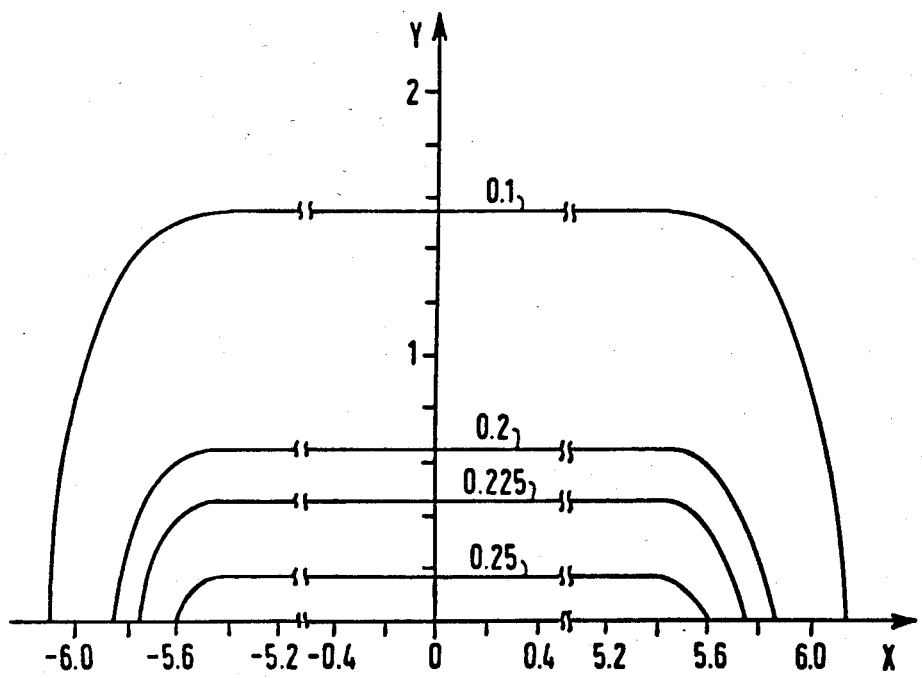

While according to FIG. 5, a shape of the lines of constant effective magnetic a-c field strength is obtained in the y-z plane which has substantially the shape of the lines of the diagram according to FIG. 2, the shape of the lines of diagram 6 permits a more unambiguous statement regarding the location of the signal source in the y-z plane since, apart from end effects, approximately the same field conditions prevail in each y-z plane.

In the embodiment of the coil winding as shown in FIG. 4 according to the invention, it was assumed that the winding is formed by only a single conductor loop. The winding can, of course, contain several turns of a conductor forming a common loop.

In the foregoing specification, the invention has been described with reference to specific exemplary embodiments thereof. It will, however, be evident that various modifications and changes may be made thereunto without departing from the broader spirit and scope of the invention as set forth in the appended claims. The specification and drawings are, accordingly, to be regarded in an illustrative rather than a restrictive sense.

What is claimed is:

1. Apparatus for at least one of generating a magnetic high-frequency field and receiving corresponding high-frequency signals in nuclear spin resonance apparatus having means for receiving a body to be examined and comprising surface coil winding means arranged within at least a partially homogeneous magnetic field region of a magnetic field generated by a base field magnet, said magnetic field having an orientation direction, the body being introduceable into said means for receiving along an axis parallel to said orientation direction, said surface coil winding means adapted to be disposed either directly on only one side of a surface of the body to be examined or at least in the vicinity of only said one side of the surface of the body and generating an inhomogeneous magnetic field in said body, said surface coil winding means having a substantially rectangular shape and having at least two parallel-extending longitudinal conductor sections and at least two transverse conductor sections, said transverse conductor sections coupling pairs of said longitudinal conductor sections, said longitudinal conductor sections being substantially longer than said transverse conductor sections, said longitudinal conductor sections being arranged substantially perpendicular to the orientation direction of the magnetic field of the base field magnet.

2. The apparatus recited in claim 1, wherein a smallest length of said longitudinal conductor sections of said coil winding means is at least three times longer than the length of said transverse conductor sections.

3. The apparatus recited in claim 1 further comprising means for shielding said transverse conductor sections from external high-frequency signals.

4. The apparatus recited in claim 1 wherein the longitudinal conductor sections are arranged substantially in a first plane and the transverse conductor sections are arranged at a larger distance from a surface of the body to be examined than the longitudinal conductor sections substantially in a second plane substantially parallel to the first plane and at a distance from said first plane.

5. The apparatus recited in claim 2 further comprising means for shielding said transverse conductor sections from external high frequency signals.

6. The apparatus recited in claim 2 wherein the longitudinal conductor sections are arranged substantially in a first plane and the transverse conductor sections are arranged at a larger distance from a surface of the body to be examined than the longitudinal conductor sections substantially in a second plane substantially parallel to the first plane and at a distance from said first plane.

* * * * *